US011524322B2

(12) United States Patent
Fujimoto et al.

(10) Patent No.: US 11,524,322 B2
(45) Date of Patent: Dec. 13, 2022

(54) JIG FOR ATTACHING AND DETACHING CLEANING MEMBER

(71) Applicant: EBARA CORPORATION, Tokyo (JP)

(72) Inventors: Tomoaki Fujimoto, Tokyo (JP);
Shuichi Suemasa, Tokyo (JP);
Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 267 days.

(21) Appl. No.: 16/889,806

(22) Filed: Jun. 2, 2020

(65) Prior Publication Data

US 2020/0391258 A1 Dec. 17, 2020

(30) Foreign Application Priority Data

Jun. 11, 2019 (JP) .............................. JP2019-108375

(51) Int. Cl.
*B08B 13/00* (2006.01)
*B08B 1/00* (2006.01)
*H01L 21/67* (2006.01)
*B08B 3/04* (2006.01)

(52) U.S. Cl.
CPC .............. *B08B 13/00* (2013.01); *B08B 1/002* (2013.01); *B08B 3/04* (2013.01); *H01L 21/67028* (2013.01)

(58) Field of Classification Search
CPC ........... B08B 13/00; B08B 1/002; B08B 3/04; H01L 21/67028; H01L 21/67046; H01L 21/304; H01L 21/02057; A46B 13/001; A46B 13/02; A46B 2200/3086; B24B 29/00; B44D 3/006
See application file for complete search history.

(56) References Cited

U.S. PATENT DOCUMENTS 74,514 A * 2/1868 Davidge ................. B66C 1/422
294/131
1,095,054 A * 4/1914 Weisenfeld ............. B66C 1/422
606/205

(Continued)

FOREIGN PATENT DOCUMENTS

JP 2005238011 9/2005
JP 4437194 3/2010

OTHER PUBLICATIONS

CudaKitchen_NPL (https://www.cudakitchen.com/nexstep-96210-lobby-dust-pan-clips-6-pack?gclid=EAIaIQobChMI3PjqksKI9wIVIIiGCh1gigLIEAQYAyABEgLSIPD_BwE) (Year: 2013).*

*Primary Examiner* — Orlando E Aviles
*Assistant Examiner* — Jacob Adam Montgomery
(74) *Attorney, Agent, or Firm* — JCIPRNET

(57) ABSTRACT

The disclosure provides a jig for attaching and detaching a cleaning member, which facilitates attaching and detaching the cleaning member to and from a rotation device without holding the cleaning member directly by hand, even when there is no sufficient spacing around the cleaning member. The jig 100 for attaching and detaching a cleaning member 60 includes a pair of jig bodies 110 capable of clamping two ends 63 of a holder 62 of the cleaning member 60, and a connecting mechanism 120 that interlocks the movements of the pair of jig bodies 110 between a clamped state in which two ends 63 of the holder 62 are clamped and a non-clamped state in which the clamped state is released.

9 Claims, 8 Drawing Sheets

(56) References Cited

U.S. PATENT DOCUMENTS

| | | | | | |
|---|---|---|---|---|---|
| 1,360,114 | A | * | 11/1920 | Kay | A47J 45/10 |
| | | | | | 294/32 |
| 1,553,734 | A | * | 9/1925 | Wilson | A01K 55/00 |
| | | | | | 449/62 |
| 1,787,331 | A | * | 12/1930 | Wilson | B65G 7/12 |
| | | | | | 294/118 |
| 1,974,255 | A | * | 9/1934 | Behrendt | B65D 71/50 |
| | | | | | 294/87.24 |
| 2,016,356 | A | * | 10/1935 | Alberg | F24B 15/10 |
| | | | | | 294/118 |
| 2,507,368 | A | * | 5/1950 | Carlson | E04G 21/162 |
| | | | | | 294/16 |
| 2,643,151 | A | * | 6/1953 | Zupancic | A01K 97/00 |
| | | | | | 43/53.5 |
| 2,997,326 | A | * | 8/1961 | Daum | A01K 55/00 |
| | | | | | 294/118 |
| 3,384,407 | A | * | 5/1968 | Thrash | F24B 15/10 |
| | | | | | 294/16 |
| 5,588,689 | A | * | 12/1996 | Ochs | B25B 7/00 |
| | | | | | 294/16 |
| 10,285,384 | B2 | * | 5/2019 | Victory | B25B 7/14 |

* cited by examiner

JIG FOR ATTACHING AND DETACHING CLEANING MEMBER

CROSS-REFERENCE TO RELATED APPLICATION

This application claims the priority benefits of Japanese application no. 2019-108375, filed on Jun. 11, 2019. The entirety of the above-mentioned patent application is hereby incorporated by reference herein and made a part of this specification.

BACKGROUND

Technical Field

The disclosure relates to a jig for attaching and detaching a cleaning member.

Description of Related Art

Patent Literature 1 below discloses an attaching and detaching jig for attaching and detaching a cleaning brush (cleaning member) for scrubbing and cleaning a substrate to and from a cleaning device (rotation device). In a semiconductor manufacturing device or the like, it is required that the substrate be cleaned with high cleanliness. Therefore, when attaching a cleaning brush to a cleaning device, it is necessary to prevent the hand from touching the bristles (body) and to prevent the bristles from getting dirty or bent.

For this purpose, the jig for attaching and detaching a cleaning brush described in Patent Literature 1 described below is provided with a pair of jig bodies, a locking member, and a gripping member. The pair of jig bodies are formed with an engaging member, which engages with the supporting shafts at two ends of the cleaning brush, open on one end surface. The locking member is detachably inserted and held in an attaching hole formed in the above-described jig bodies to close the open end of the above-described engaging member and to hold the above-described jig bodies on the above supporting shafts so that the above engaging member does not come off the supporting shafts. The gripping member has both ends connected to the pair of jig bodies and prevents the engaging member of these jig bodies from being pulled out in the axial direction of the supporting shafts. The above cleaning brush is attached to and detached from the above cleaning device by gripping the above gripping member.

RELATED ART

Patent Literature

[Patent Literature 1] Japanese Patent No. 4437194

SUMMARY

Problems to be Solved

In recent semiconductor manufacturing devices, the spacing (clearance) between the cleaning member and the rotation device to which two ends of the cleaning member are attached is so small that a hand does not fit, which may make it difficult to attach the cleaning member to the rotation device while keeping the hand from touching the body. When a hand does not fit the spacing between the cleaning member and the rotation device, even if the cleaning member is attached to the rotation device using the attaching and detaching jig of the above-described conventional technology, the above-described locking member that holds the cleaning member cannot be pulled out of the jig bodies, and the attaching and detaching jig may not be able to be detached from the cleaning member.

The disclosure provides a jig for attaching and detaching a cleaning member that allows the cleaning member to be easily attached to and detached from a rotation device without directly holding the cleaning member by hand, even if there is no sufficient spacing around the cleaning member.

Means for Solving the Problems

A jig for attaching and detaching a cleaning member is provided according to one embodiment of the disclosure. The cleaning member includes: a body scrubbing and cleaning an object; and a holder holding the body, wherein two ends of the holder are attachable to and detachable from a rotation device. The jig includes: a pair of jig bodies clamping the two ends of the holder exposed from a spacing between the body and the rotation device; and a connecting mechanism connecting the pair of jig bodies and interlocking movements of the pair of jig bodies between a clamped state in which the two ends of the holder are clamped and a non-clamped state in which the clamped state is released.

In the above-described jig for attaching and detaching the cleaning member, each of the pair of jig bodies includes clamping pieces that intersect at one intersection and are openable and closable around the intersection. The connecting mechanism includes: a connecting shaft connecting the pair of jig bodies to each other at the intersection of the clamping pieces; and a pair of gripping shafts connecting the pair of jig bodies to each other at a second end on an opposite side of a first end, where the clamping pieces clamp the holder, across the intersection. The above-described jig for attaching and detaching the cleaning member includes a fixing member fixing the pair of gripping shafts and maintaining the clamped state. In the above-described jig for attaching and detaching the cleaning member, an annular groove is formed on a peripheral surface of at least one of the pair of gripping shafts, and the fixing member is engaged with the annular groove. In the above-described jig for attaching and detaching the cleaning member, the connecting shaft is connected rotatably relative to the clamping pieces, and each of the pair of gripping shafts is connected non-rotatably relative to the clamping pieces. The above-described jig for attaching and detaching the cleaning member includes an interval adjustment mechanism adjusting an interval between the pair of jig bodies.

Effects

According to one embodiment of the disclosure, the cleaning member can be easily attached to and detached from the rotation device without directly holding the cleaning member by hand, even if there is no sufficient spacing around the cleaning member.

Figure 7:
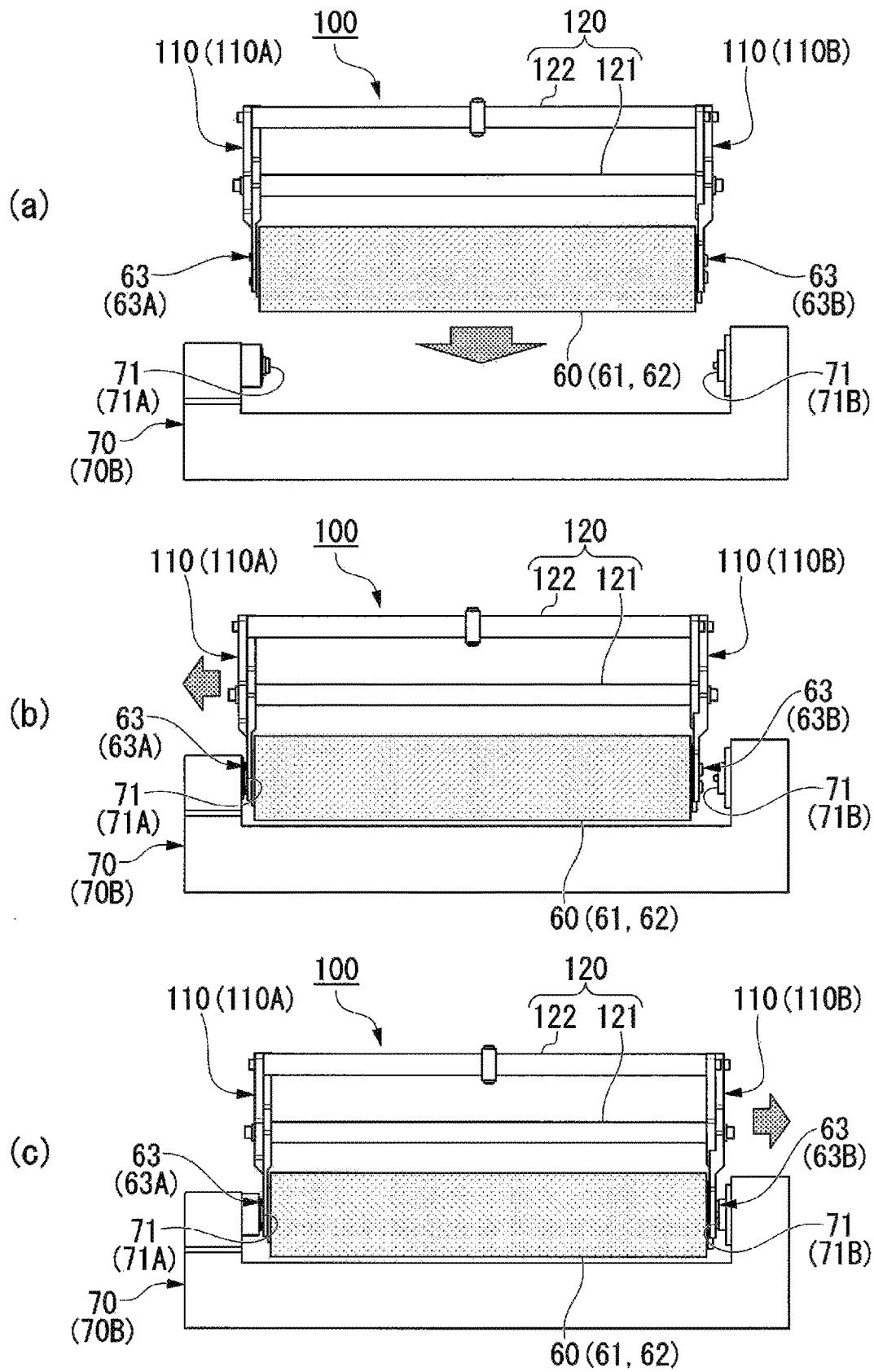

(a) to (c) of FIG. 7 are explanatory views showing a procedure for attaching a cleaning member to a rotation device according to one embodiment.

Figure 8:
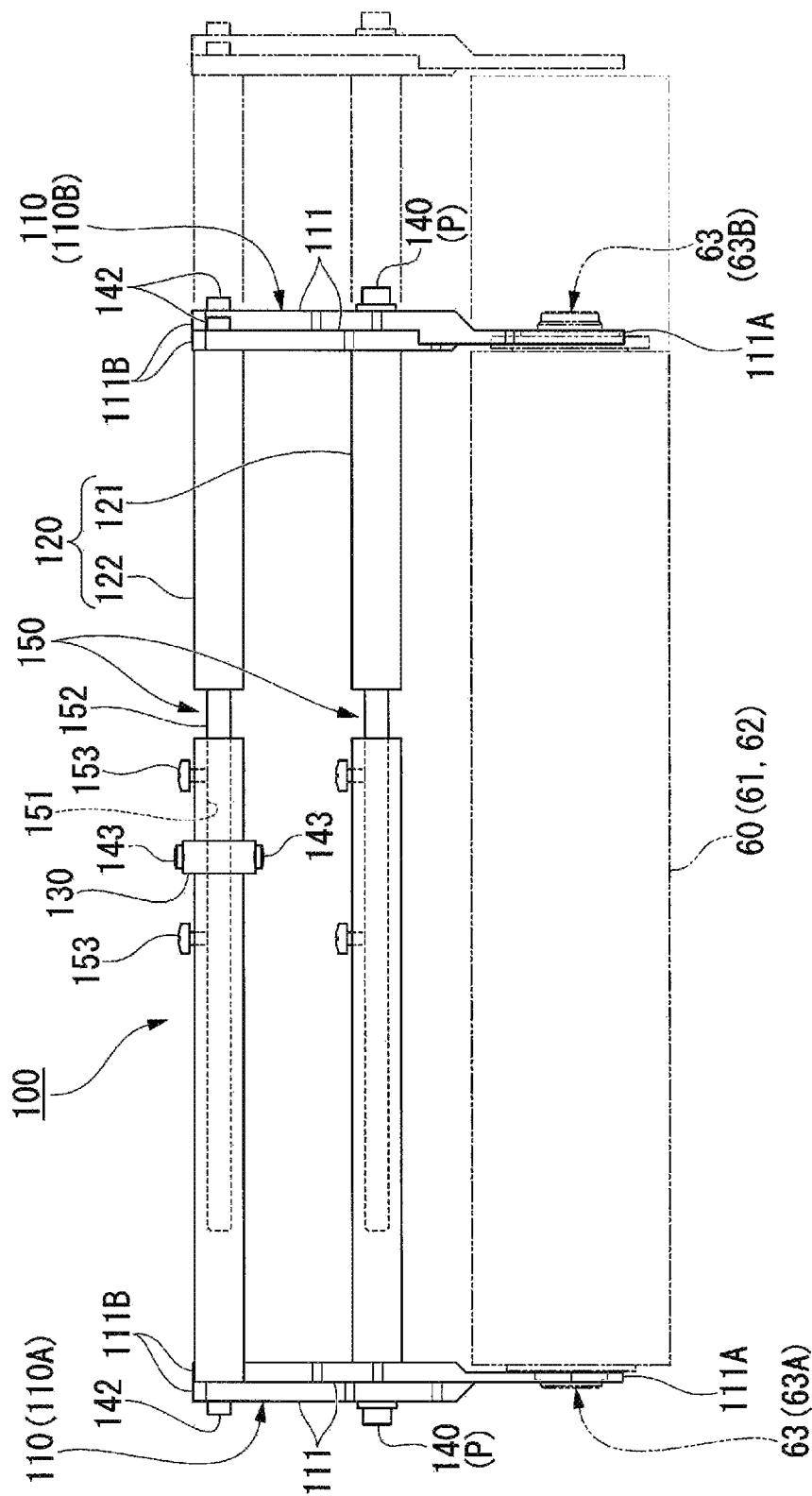

FIG. 8 is a front view of a jig for attaching and detaching a cleaning member according to a modified example of one embodiment.

DETAILED DESCRIPTION

One embodiment of the disclosure will be described below with reference to the drawings. Hereinafter, as an application example of the jig for attaching and detaching a cleaning member, a substrate processing device having a cleaning member for cleaning the substrate and requiring attachment and detachment of the cleaning member will be exemplified.

Figure 1:
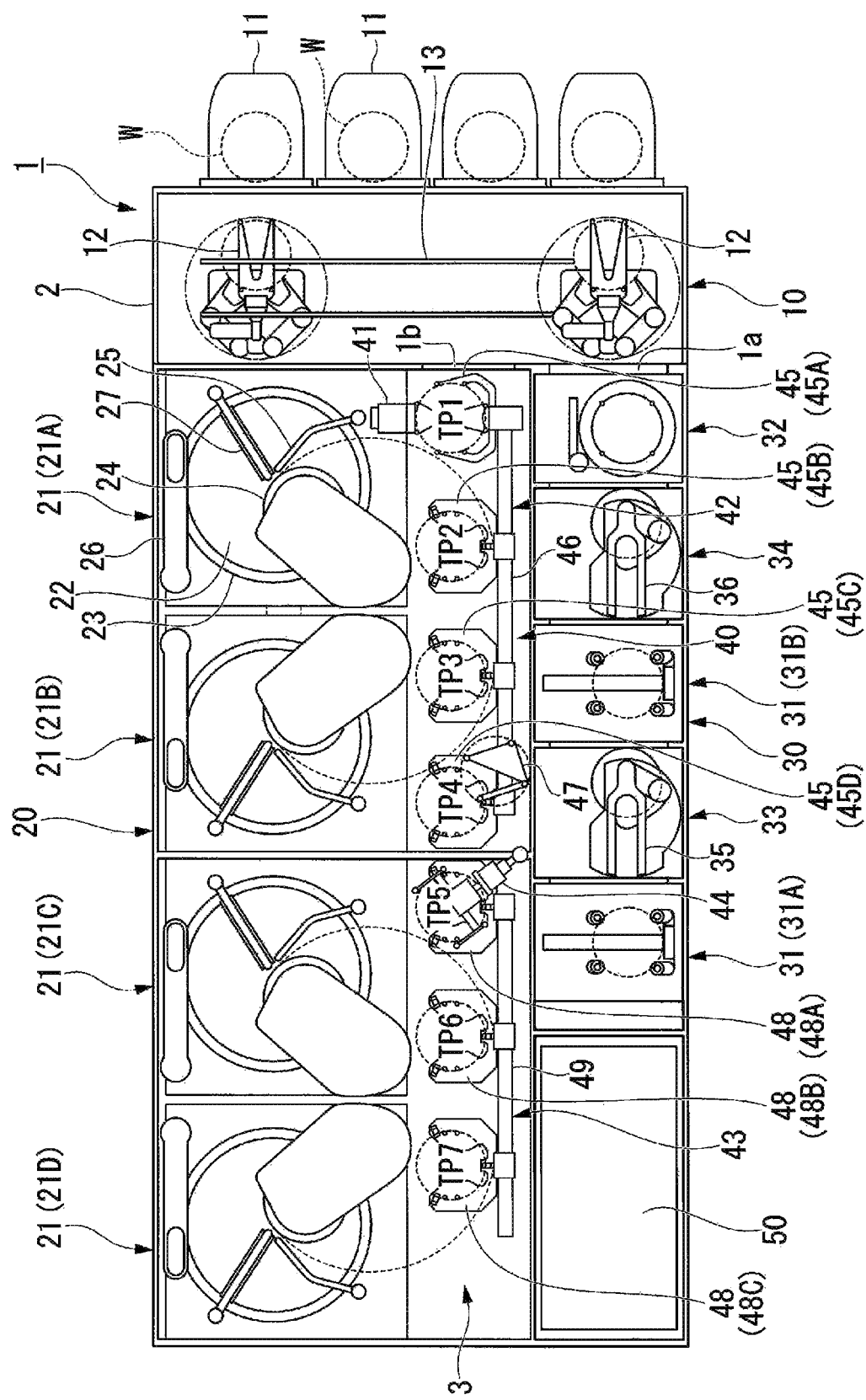
FIG. 1 is a plan view showing an overall configuration of a substrate processing device according to one embodiment.

FIG. 1 is a plan view showing an overall configuration of a substrate processing device 1 according to one embodiment. The substrate processing device 1 shown in FIG. 1 is a chemical mechanical polishing (CMP) device for flatly polishing the surface of a substrate W, such as a silicon wafer. The substrate processing device 1 includes a rectangular box-shaped housing 2. The housing 2 is formed in a substantially rectangular shape in a plan view.

The housing 2 includes a substrate transport path 3 extending in the longitudinal direction in the center. A loading/unloading member 10 is provided at one end in the longitudinal direction of the substrate transport path 3. A polishing member 20 is provided on one side of the substrate transport path 3 in the width direction (in the direction orthogonal to the longitudinal direction in a plan view), and a cleaning member 30 is provided on the other side. The substrate transport path 3 includes a substrate transport member 40 that transports the substrate W. In addition, the substrate processing device 1 includes a control member 50 (controller) that comprehensively controls the operations of the loading/unloading member 10, the polishing member 20, the cleaning member 30, and the substrate transport member 40.

The loading/unloading member 10 includes a front-loading member 11 that houses the substrate W. A plurality of the front-loading members 11 are provided on a side surface on one side of the housing 2 in the longitudinal direction. The plurality of front-loading members 11 are arranged in the width direction of the housing 2. The front-loading members 11 includes, for example, an open cassette, a SMIF (Standard Manufacturing Interface) pod, or a FOUP (Front Opening Unified Pod). The SMIF or FOUP is a sealed container containing a cassette of the substrate W inside and covered with a partition, and can maintain an independent environment in an external space.

Further, the loading/unloading member 10 includes two transport robots 12 for taking in and out the substrate W from the front-loading members 11, and a running mechanism 13 for running each transport robot 12 along the front-loading members 11. Each transport robot 12 includes two hands at the top and bottom, which are used separately before and after processing the substrate W. For example, the upper hand is used when returning the substrate W to the front-loading members 11, and the lower hand is used when removing the pre-processed substrate W from the front-loading members 11.

The polishing member 20 includes a plurality of substrate polishing devices 21 (21A, 21B, 21C, 21D) for polishing (flattening) the substrate W. A plurality of substrate polishing devices 21 are arranged in the longitudinal direction of the substrate transport path 3. Each substrate polishing device 21 includes a polishing table 23 for rotating a polishing pad 22 having a polishing surface, a top ring 24 for holding the substrate W and polishing the substrate W while pressing the substrate W against the polishing pad 22 on the polishing table 23, a polishing liquid supply nozzle 25 for supplying polishing liquid or dressing liquid (e.g., pure water) to the polishing pad 22, a dresser 26 for dressing the polishing surface of the polishing pad 22, and an atomizer 27 for atomizing and spraying a mixture of liquid (e.g., pure water) and gas (e.g., nitrogen gas) or liquid (e.g., pure water) onto the polishing surface.

The substrate polishing device 21 polishes the substrate W and flattens a surface of the substrate W by pressing the substrate W against the polishing pad 22 with the top ring 24 and moving the top ring 24 and the polishing table 23 relative to each other while supplying polishing liquid from the polishing liquid supply nozzle 25 to the polishing pad 22. The dresser 26 has hard particles, such as diamond particles or ceramic particles, fixed to a rotating member of a tip in contact with the polishing pad 22, and by rotating and swinging the rotating member, uniformly dresses the entire polishing surface of the polishing pad 22 to form a flat polishing surface. The atomizer 27 washes away the polishing waste and abrasive particles remaining on the polishing surface of the polishing pad 22 with a high-pressure liquid, thereby achieving the purification of the polishing surface and the work of sharpening the polishing surface by the dresser 26, which is a mechanical contact, i.e., regeneration of the polishing surface.

The cleaning member 30 includes a plurality of substrate cleaning devices 31 (31A, 31B) for cleaning the substrate W, and a substrate drying device 32 for drying the cleaned substrate W. The plurality of substrate cleaning devices 31 and the substrate drying device 32 are arranged in the longitudinal direction of the substrate transport path 3. A first transport chamber 33 is provided between the substrate cleaning device 31A and the substrate cleaning device 31B. In the first transport chamber 33, a transport robot 35 is provided to transport a substrate W between the substrate transport member 40, the substrate cleaning device 31A, and the substrate cleaning device 31B. Further, a second transport chamber 34 is provided between the substrate cleaning device 31B and the substrate drying device 32. In the second transport chamber 34, a transport robot 36 is provided to transport a substrate W between the substrate cleaning device 31B and the substrate drying device 32.

The substrate cleaning device 31 includes, for example, a roll sponge-type cleaning module described below, and cleans the substrate W. Further, the substrate cleaning device 31A and the substrate cleaning device 31B may be the same type or different types of cleaning modules; for example, a pencil sponge type cleaning module or a two-liquid jet type cleaning module may be used. The substrate drying device 32 includes, for example, a drying module for performing Rotagoni drying (Iso-Propyl Alcohol (IPA) drying). After drying, a shutter 1a provided on the partition between the substrate drying device 32 and the loading/unloading member 10 is opened, and the substrate W is removed from the substrate drying device 32 by the transport robot 12.

The substrate transport member 40 includes a lifter 41, a first linear transporter 42, a second linear transporter 43, and a swing transporter 44. In the substrate transport path 3, a first transport position TP1, a second transport position TP2, a third transport position TP3, a fourth transport position TP4, a fifth transport position TP5, a sixth transport position TP6, and a seventh transport position TP7 are set in order from the loading/unloading member 10 side.

The lifter 41 is a mechanism that transports the substrate W up and down at the first transport position TP1. The lifter 41 receives the substrate W from the transport robot 12 of the loading/unloading member 10 at the first transport position TP1. In addition, the lifter 41 transports the substrate W received from the transport robot 12 to the first linear transporter 42. A shutter 1b is provided on the partition between the first transport position TP1 and the loading/unloading member 10, and the shutter 1b is opened when the substrate W is transported, and the substrate W is transported from the transport robot 12 to the lifter 41.

The first linear transporter 42 is a mechanism that transports the substrate W between the first transport position TP1, the second transport position TP2, the third transport position TP3, and the fourth transport position TP4. The first linear transporter 42 includes a plurality of transport hands 45 (45A, 45B, 45C, 45D) and a linear guide mechanism 46 that moves each of the transport hands 45 horizontally at a plurality of heights. The transport hand 45A moves between the first transport position TP1 and the fourth transport position TP4 by the linear guide mechanism 46. The transport hand 45A is a pass hand that receives a substrate W from the lifter 41 and transports the substrate W to the second linear transporter 43.

The transport hand 45B moves between the first transport position TP1 and the second transport position TP2 by the linear guide mechanism 46. The transport hand 45B receives the substrate W from the lifter 41 at the first transport position TP1, and transports the substrate W to the substrate polishing device 21A at the second transport position TP2. The transport hand 45B includes a lift driving member, which ascends when the substrate W is transported to the top ring 24 of the substrate polishing machine 21A and descends after the substrate W is transported to the top ring 24. In addition, the transport hands 45C and 45D also have the same lift driving members.

The transport hand 45C moves between the first transport position TP1 and the third transport position TP3 by the linear guide mechanism 46. The transport hand 45C receives the substrate W from the lifter 41 at the first transport position TP1 and transports the substrate W to the substrate polishing device 21B at the third transport position TP3. The transport hand 45C also functions as an access hand that receives the substrate W from the top ring 24 of the substrate polishing device 21A at the second transport position TP2 and transports the substrate W to the substrate polishing device 21B at the third transport position TP3.

The transport hand 45D moves between the second transport position TP2 and the fourth transport position TP4 by the linear guide mechanism 46. The transport hand 45D functions as an access hand that receives the substrate W from the top ring 24 of the substrate polishing device 21A or the substrate polishing device 21B at the second transport position TP2 or the third transport position TP3 and transports the substrate W to the swing transporter 44 at the fourth transport position TP4.

The swing transporter 44 includes a hand that can move between the fourth transport position TP4 and the fifth transport position TP5, and transports the substrate W from the first linear transporter 42 to the second linear transporter 43. In addition, the swing transporter 44 transports the substrate W polished at the polishing member 20 to the cleaning member 30. On the side of the swing transporter 44, a temporary table 47 for the substrate W is provided. The swing transporter 44 turns the substrate W received at the fourth transport position TP4 or the fifth transport position TP5 upside down and places the substrate W on the temporary table 47. The substrate W placed on the temporary table 47 is transported to the first transport chamber 33 by the transport robot 35 of the cleaning member 30.

The second linear transporter 43 is a mechanism that transports the substrate W between the fifth transport position TP5, the sixth transport position TP6, and the seventh transport position TP7. The second linear transporter 43 includes a plurality of transport hands 48 (48A, 48B, 48C) and a linear guide mechanism 49 that moves each of the transport hands 48 horizontally at a plurality of heights. The transport hand 48A moves between the fifth transport position TP5 and the sixth transport position TP6 by the linear guide mechanism 49. The transport hand 45A functions as an access hand that receives the substrate W from the swing transporter 44 and transports the substrate W to the substrate polishing device 21C.

The transport hand 48B moves between the sixth transport position TP6 and the seventh transport position TP7. The transport hand 48B functions as an access hand that receives the substrate W from the substrate polishing device 21C and transports the substrate W to the substrate polishing device 21D. The transport hand 48C moves between the seventh transport position TP7 and the fifth transport position TP5. The transport hand 48C functions as an access hand that receives the substrate W from the top ring 24 of the substrate polishing device 21C or the substrate polishing device 21D at the sixth transport position TP6 or the seventh transport position TP7 and transports the substrate W to the swing transporter 44 at the fifth transport position TP5. Although the explanation is omitted, the operation of the transport hand 48 when transporting the substrate W is the same as the operation of the first linear transporter 42 described above.

Figure 2:
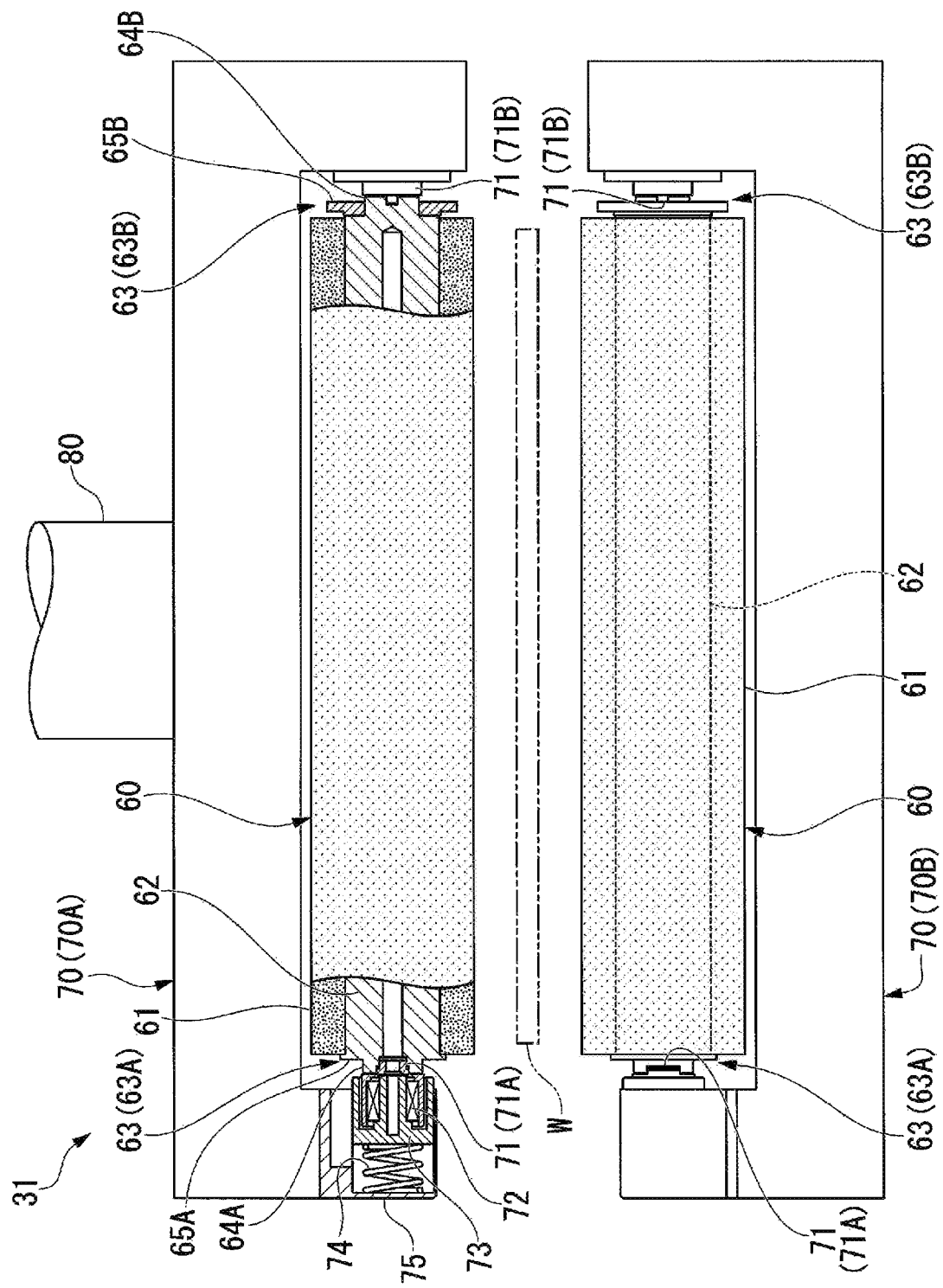
FIG. 2 is a configuration view of a substrate cleaning device according to one embodiment.

FIG. 2 is a configuration view of the substrate cleaning device 31 according to one embodiment. The substrate cleaning device 31 shown in FIG. 2 includes a cleaning member 60 that scrubs and cleans the substrate W, and a rotation device 70 that rotates the cleaning member 60. The cleaning member 60 and the rotation device 70 are disposed above and below the substrate W. A rotation device 70A disposed above the substrate W is connected to an arm 80 and can move vertically and horizontally. A rotation device 70B disposed below the substrate W is fixed to a base (not shown) or the like.

The cleaning member 60 includes a body 61 for scrubbing and cleaning the substrate W, and a holder 62 for holding the body 61. The body 61 is a cylindrical sponge, and is formed of, for example, a sponge made of PVA (polyvinyl alcohol) or a sponge made of urethane. Further, the body 61 may be a brush having bristles on a peripheral surface.

The holder 62 is a shaft that supports the body 61 and is inserted and disposed through the inside of the body 61. The holder 62 is made of, for example, PVC (polyvinyl chloride) or PEEK (polyether ether ketone). Two ends 63 of the holder 62 extend axially beyond two end surfaces of the body 61.

A shaft 64A and a flange 65A are formed on one (one end 63A) of the two ends 63 of the holder 62. A shaft 64B is formed on the other end (the other end 63B) of the two ends 63 of the holder 62, and a screw (not shown) is formed on a peripheral surface of the shaft 64B and a nut 65B is screwed. The flange 65A and the nut 65B are axially opposed to two end surfaces of the body 61.

The rotation device 70 includes a pair of rotating shafts 71 to which two ends 63 of the holder 62 are attached. One of the pair of rotating shafts 71 is a driven shaft 71A, which engages with the shaft 64A of the one end 63A of the holder 62. The driven shaft 71A is axially movable by a spring 74. Specifically, the driven shaft 71A is supported by a shaft box 73 via a bearing 72, and the shaft box 73 is pushed axially toward the cleaning member 60 by the spring 74. The shaft box 73 and the spring 74 are housed in an axially movable manner with respect to the housing 75.

Figure 5:
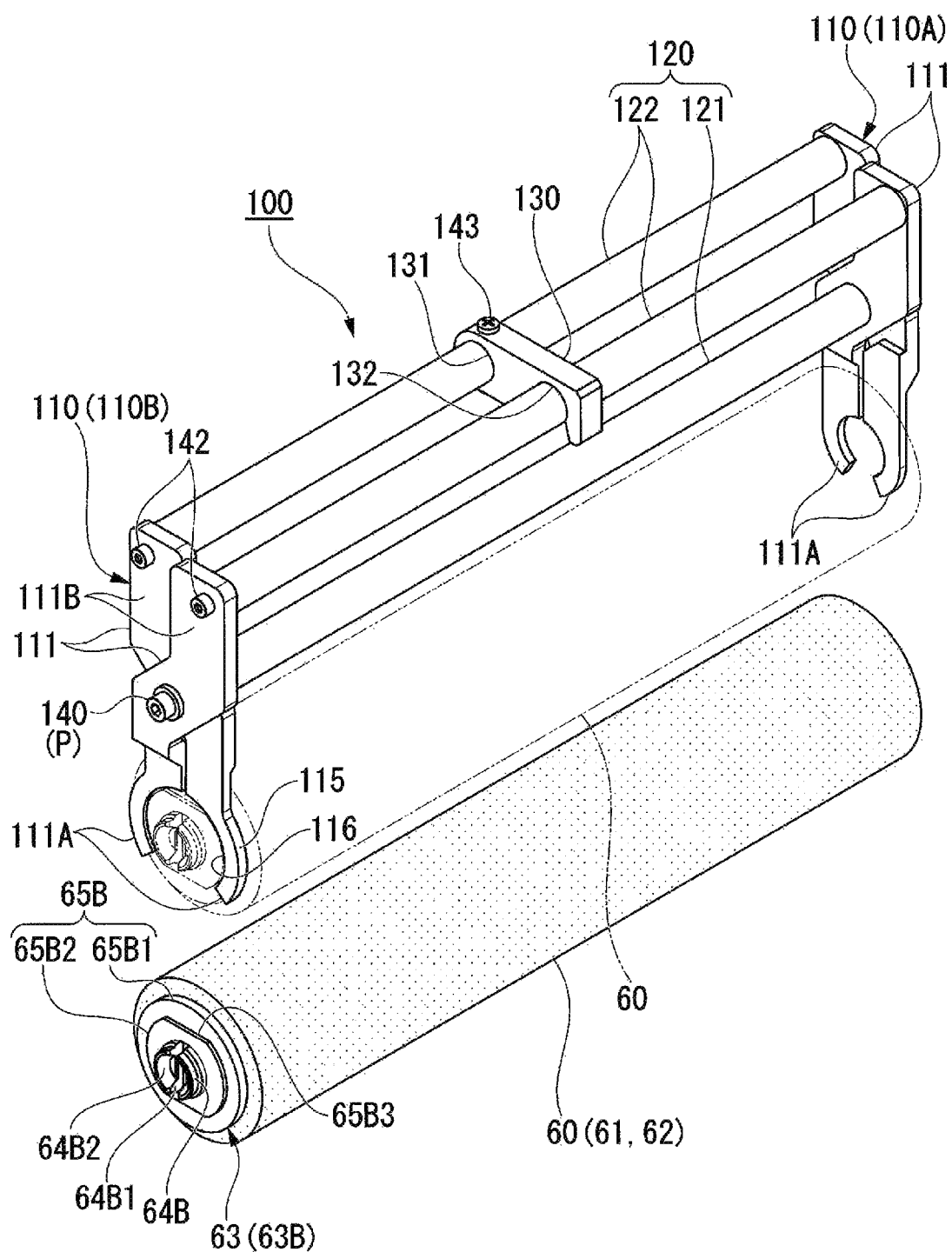
FIG. 5 is a perspective view of an attaching and detaching jig according to one embodiment as viewed from the rear right side.

The other one of the pair of rotating shafts 71 is a driving shaft 71B, which engages with the shaft 64B of the other end 63B of the holder 62. The driving shaft 71B is rotated by the drive of a motor (not shown) housed inside the rotation device 70. The driving shaft 71B has a shape with a minus (−) convex formed on the end surface of a cylindrical body. As shown in FIG. 5, which will be described later, the shaft 64B that receives the driving shaft 71B includes a slot 64B1 in which the convex of the driving shaft 71B is inserted, and an arc 64B2 which surrounds and aligns the peripheral surface of the driving shaft 71B.

Figure 4:
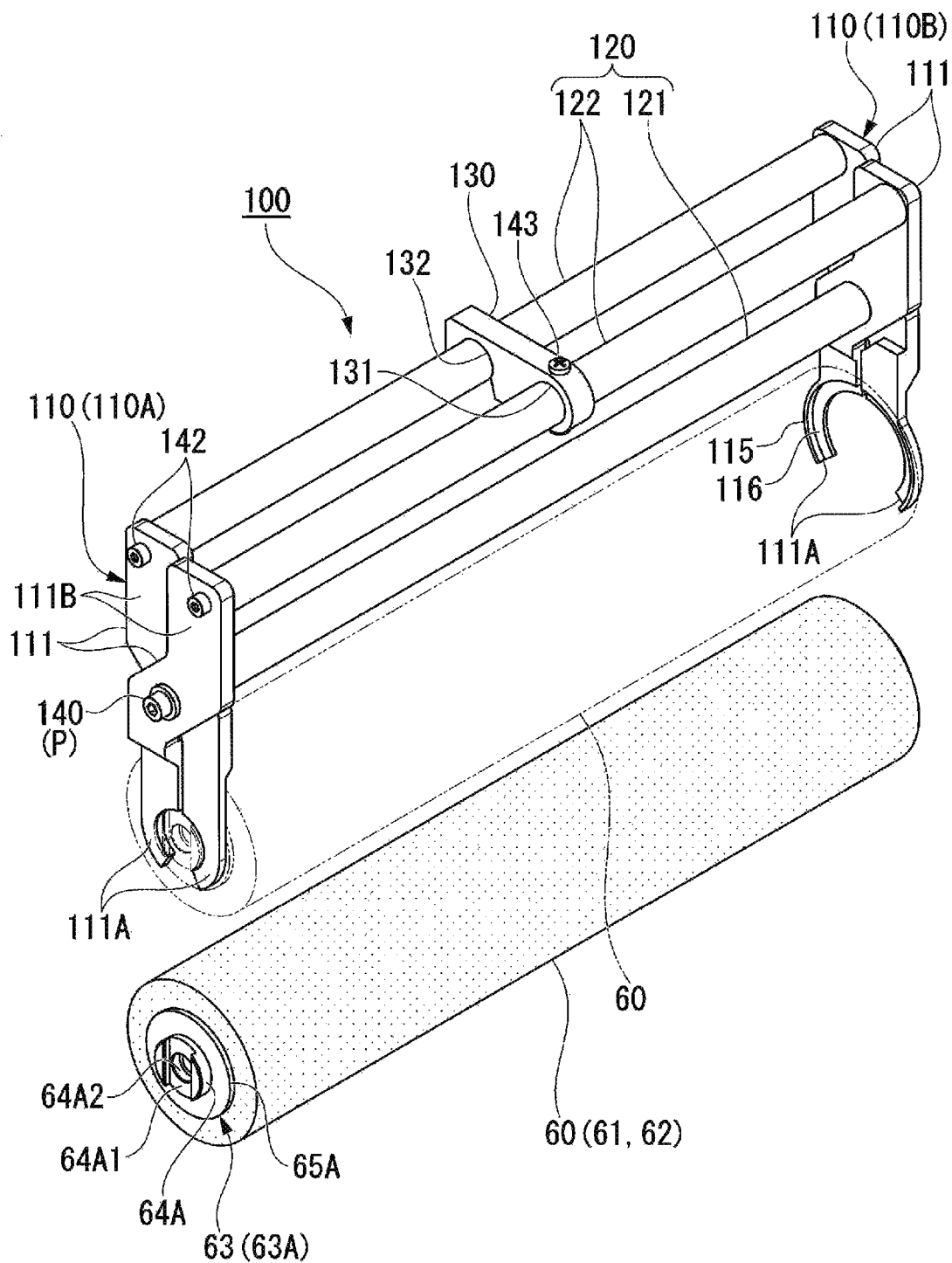
FIG. 4 is a perspective view of an attaching and detaching jig according to one embodiment as viewed from the front left side.

The driven shaft 71A is shaped with a cylindrical body standing on a minus (−) convex. As shown in FIG. 4, which will be described later, the shaft 64A that receives the driven shaft 71A includes a slot 64A1 in which the convex of the driven shaft 71A is inserted, and a hole 64A2 in which the cylindrical body of the driven shaft 71A is inserted and aligned.

Next, the configuration of the attaching and detaching jig 100 for attaching and detaching the cleaning member 60 to and from the rotation device 70 of the above-described configuration will be described.

Figure 3:
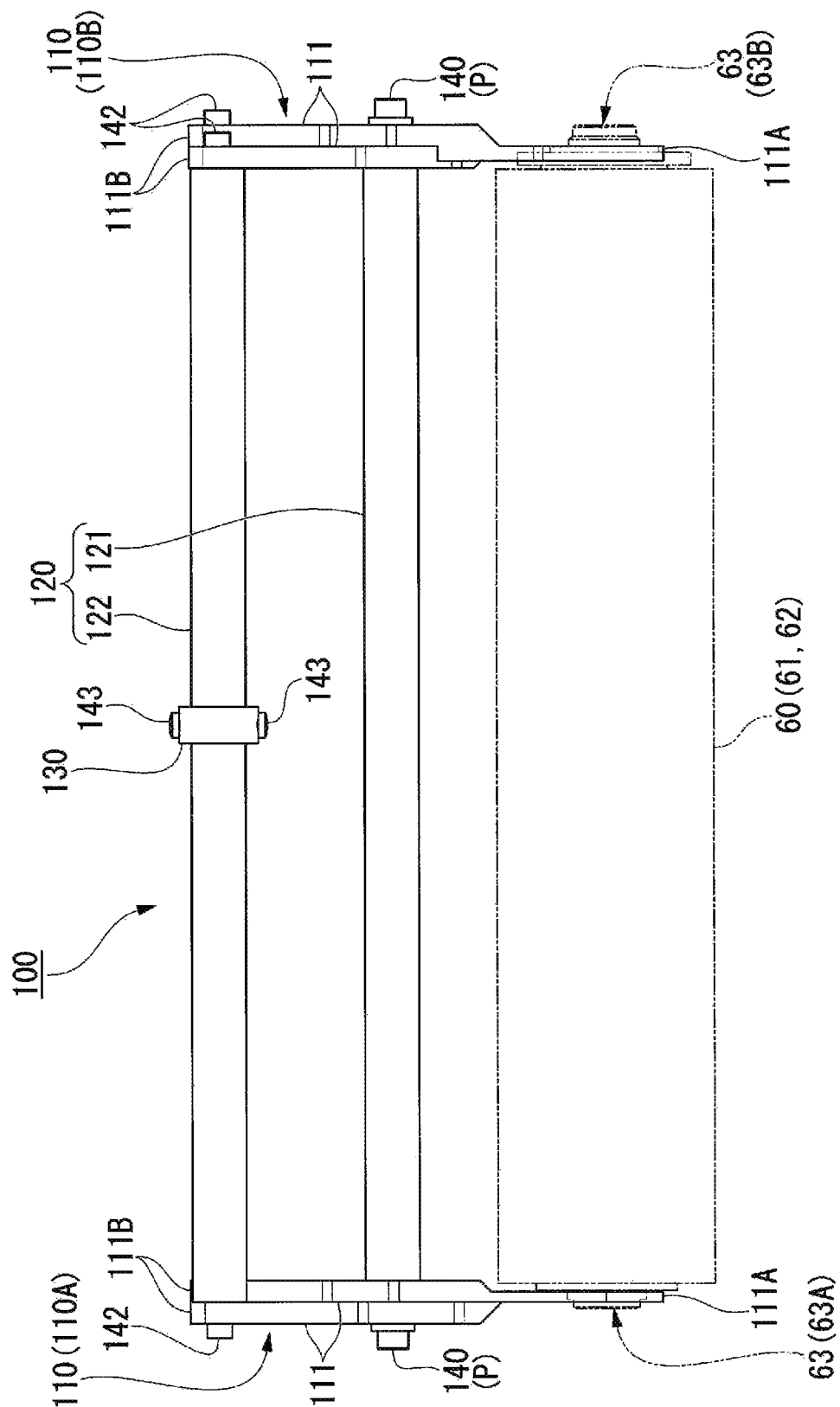
FIG. 3 is a front view of a jig for attaching and detaching a cleaning member according to one embodiment.
Figure 6:
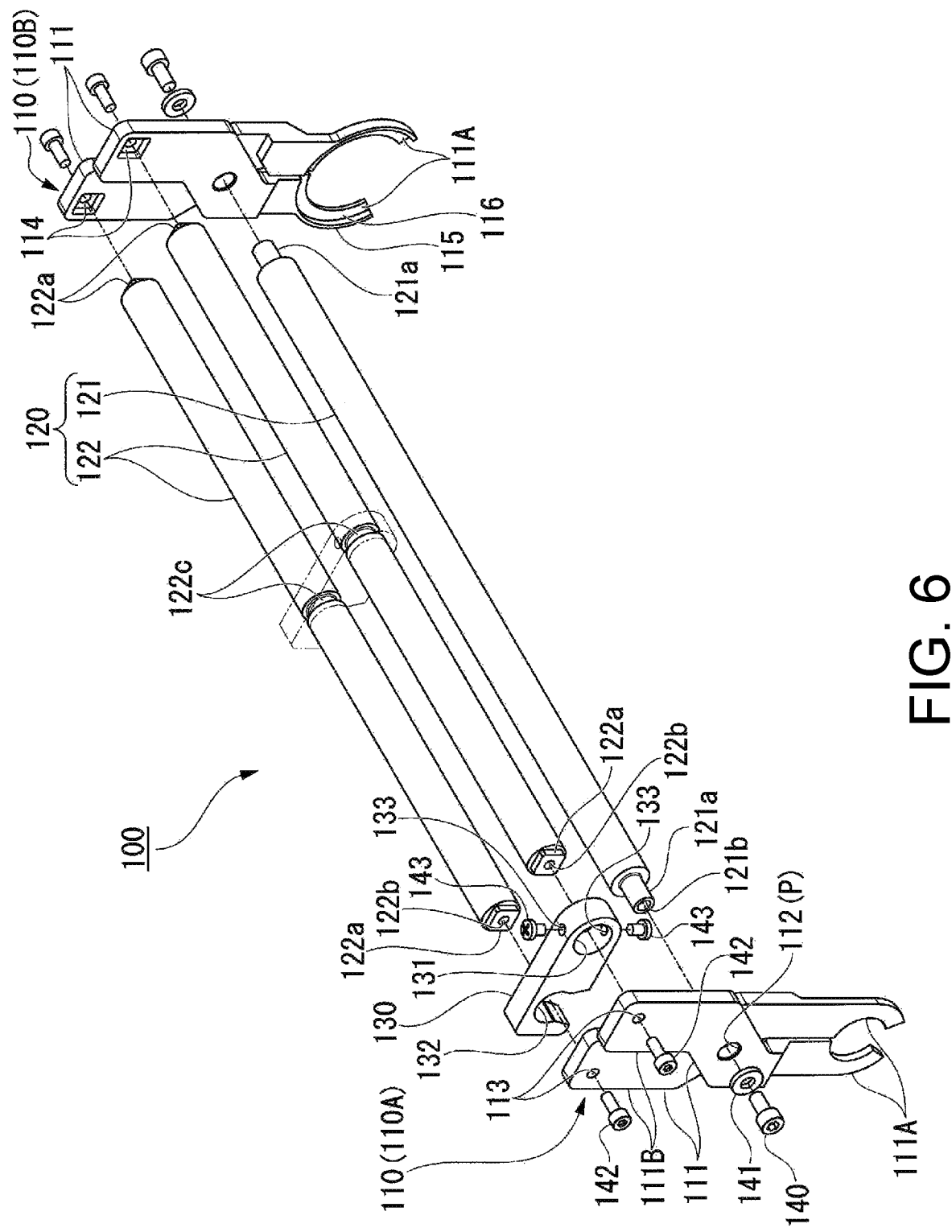
FIG. 6 is an exploded perspective view of an attaching and detaching jig according to one embodiment.

FIG. 3 is a front view of the jig 100 for attaching and detaching the cleaning member 60 according to one embodiment. FIG. 4 is a perspective view of the attaching and detaching jig 100 according to one embodiment as viewed from the front left side. FIG. 5 is a perspective view of the attaching and detaching jig 100 according to one embodiment as viewed from the rear right side. FIG. 6 is an exploded perspective view of the attaching and detaching jig 100 according to one embodiment. As shown in these figures, the jig 100 for attaching and detaching the cleaning member 60 includes a pair of jig bodies 110 and a connecting mechanism 120 for connecting the pair of jig bodies 110.

As shown in FIG. 2 above, the pair of jig bodies 110 are configured to be able to clamp two ends 63 of the holder 62 exposed from the spacing between the body 61 and the rotation device 70. As shown in FIGS. 4 and 5, each of the pair of jig bodies 110 is provided with clamping pieces 111 (scissors) that intersect at one intersection P and can be opened and closed around the intersection P.

The connecting mechanism 120 includes a connecting shaft 121 that connects the pair of jig bodies 110 to each other at the intersections P of the clamping pieces 111, and a pair of gripping shafts 122 that connect the pair of jig bodies 110 to each other at the second ends 111B on the opposite side of first ends 111A (claw), where the clamping pieces 111 clamp the holder 62, across the intersection P.

As shown in FIG. 6, the connecting shaft 121 is connected rotatably relative to the clamping pieces 111. Specifically, cylindrical shafts 121a are formed at two ends of the connecting shaft 121, and the cylindrical shafts 121a are inserted into through holes 112 formed at the intersections P of the clamping pieces 111. At the tips of the cylindrical shafts 121a, holes 121b are formed, and screws 140 are screwed into the holes 121b through washers 141, so that the connecting shaft 121 can be connected rotatably relative to the clamping pieces 111.

On the other hand, each of the pair of gripping shafts 122 is connected non-rotatably relative to the clamping pieces 111. Specifically, prismatic shafts 122a are formed at two ends of the gripping shafts 122, and the prismatic shafts 122a are engaged with square grooves 114 formed at the second ends 111B of the clamping pieces 111. At the bottom of the square grooves 114, through holes 113 are formed to penetrate the clamping pieces 111 axially. At the tips of the prismatic shafts 122a, holes 122b are formed, and screws 142 are screwed into the holes 122b so that the gripping shafts 122 are connected non-rotatably relative to the clamping pieces 111.

Thus, the movements of the pair of jig bodies 110 can be interlocked. In other words, when the pair of gripping shafts 122 are brought close to each other, the clamping pieces 111 of the pair of jig bodies 110 are closed around the intersection P and become a clamped state in which two ends 63 of the holder 62 are clamped. Also, when the pair of gripping shafts 122 are separated from each other, the clamping pieces 111 of the pair of jig bodies 110 open around the intersection P, and become a non-clamped state in which two ends 63 of the holder 62 are released from the clamped state.

The attaching and detaching jig 100 includes a fixing member 130 that fixes the pair of gripping shafts 122 to each other and maintains the above-described clamped state. As shown in FIG. 6, the fixing member 130 includes a hole 131 and a hook 132. One of the pair of gripping shafts 122 is inserted into the hole 131, and the hook 132 engages with the other of the pair of gripping shafts 122.

An annular groove 122c is formed on the peripheral surface of at least one of the pair of gripping shafts 122 (both in the present embodiment), and the fixing member 130 is engaged with the annular groove 122c. Specifically, in the fixing member 130, a pair of through holes 133 communicating with the hole 131 are formed in the radial direction, and the tips of screws 143 screwed into the through holes 133 are inserted into the annular grooves 122c. In this way, the fixing member 130 can rotate around the gripping shafts 122 while the axial movement along the gripping shafts 122 is regulated.

The first ends 111A of the clamping pieces 111 of the pair of jig bodies 110 are shaped according to the shapes of the two ends 63 of the holder 62. As shown in FIG. 4, the clamping piece 111 of the jig body 110A that clamps the one end 63A of the holder 62 includes an arc-shaped first end 111A that clamps the peripheral surface of the shaft 64A on the axially outer side of the flange 65A. The lower ends of the first end 111A are spaced apart by a distance equal to or less than the diameter of the shaft 64A with the shaft 64A clamped in between.

As shown in FIG. 5, the clamping piece 111 of the jig body 110B that clamps the other end 63B of the holder 62 includes an arc-shaped first end 111A that clamps the nut 65B instead of the shaft 64B. The nut 65B includes a nut flange 65B1 and a nut turning member 65B2 arranged axially outside the nut flange 65B1. The nut turning member 65B2 is smaller in diameter than the nut flange 65B1 and includes a flat member 65B3 whose peripheral surface is notched parallel to the nut flange 65B1, and a wrench or a spanner can be engaged with the flat member 65B3.

As shown in FIG. 4, a peripheral wall 115 and a bottom wall 116 are formed at the first end 111A of the clamping piece 111 of the jig body 110B. As shown in FIG. 5, the peripheral wall 115 clamps the peripheral surface of the nut flange 65B1. Also, the bottom wall 116 is axially opposed to the nut flange 65B1 and the inner peripheral surface of the bottom wall 116 clamps the peripheral surface other than the flat member 65B3 of the nut turning member 65B2. In addition, the lower ends of the first end 111A are spaced apart by a distance equal to or less than the diameter of the nut flange 65B1 and equal to or less than the diameter of the peripheral surface of the nut turning member 65B2 with the nut 65B clamped in between.

Next, the procedure of attaching the cleaning member 60 to the rotation device 70 using the attaching and detaching jig 100 of the above-described configuration will be described.

(a) to (c) of FIG. 7 are explanatory views showing a procedure for attaching the cleaning member 60 to the rotation device 70 according to one embodiment. The rotation device 70 shown in FIG. 7 is the rotation device 70B disposed below the substrate W, but the following procedure is similar to that of the rotation device 70A disposed above the substrate W, except that the cleaning member 60 is inserted horizontally into the rotation device 70A. First, as shown in (a) of FIG. 7, two ends 63 of the holder 62 of the cleaning member 60 are clamped by the attaching and detaching jig 100.

Specifically, the fixing member 130 shown in FIG. 4 is rotated to release the lock so that the pair of gripping shafts 122 are separated from each other to open the clamping pieces 111 of the pair of jig bodies 110. Next, two ends 63 of the holder 62 of the cleaning member 60 are placed between the first ends 111A of the clamping pieces 111 to bring the pair of gripping shafts 122 close to each other to close the clamping pieces 111 of the pair of jig bodies 110. Thereafter, the fixing member 130 is rotated to engage the hook 132 with the gripping shafts 122, thereby maintaining the clamped state of the cleaning member 60.

Next, as shown in (b) of FIG. 7, after inserting the cleaning member 60 into the rotation device 70B in the vertical direction, the one end 63A of the holder 62 is pressed axially onto the driven shaft 71A of the rotation device 70. At this time, the angle of the attaching and detaching jig 100 (the cleaning member 60) is adjusted and the one end 63A of the holder 62 is engaged with the driven shaft 71A of the rotation device 70. The pressing causes the driven shaft 71A to spring back axially, forming a spacing with the rotation device 70 on the other end 63B side of the cleaning member 60.

Finally, as shown in (c) of FIG. 7, the other end 63B of the cleaning member 60 is engaged with the driving shaft 71B of the rotation device 70 using the spacing. At this time, the angle of the attaching and detaching jig 100 (cleaning member 60) is adjusted and the other end 63B of the holder 62 is engaged with the driving shaft 71B of the rotation device 70. As described above, after the cleaning member 60 is attached to the rotation device 70, the fixing member 130 shown in FIG. 4 is rotated to release the lock so that the pair of gripping shafts 122 are separated from each other to open the clamping pieces 111 of the pair of jig bodies 110, and the attaching and detaching jig 100 is detached from the cleaning member 60, which completes the attachment of the cleaning member 60 to the rotation device 70.

Thus, according to the present embodiment as described above, the jig 100 for attaching and detaching the cleaning member 60, including the body 61 for scrubbing and cleaning the substrate W and the holder 62 for holding the body 61, is provided with the pair of jig bodies 110 capable of clamping two ends 63 of the holder 62 exposed from the spacing between the body 61 and the rotation device 70; and the connecting mechanism 120 that connects the pair of jig bodies 110 and interlocks the movements of the pair of jig bodies 110 between a clamped state in which two ends 63 of the holder 52 are clamped and a non-clamped state in which the clamped state is released. By adopting such a configuration, the cleaning member 60 can be easily attached to and detached from the rotation device 70 without directly holding the cleaning member 60 by hand, even if there is no sufficient spacing around the cleaning member 60.

Also, in the present embodiment, as shown in FIGS. 4 and 5, each of the pair of jig bodies 110 is provided with the clamping pieces 111 that intersect at one intersection P and can be opened and closed around the intersection P, and the connecting mechanism 120 includes the connecting shaft 121 that connects the pair of jig bodies 110 to each other at the intersections P of the clamping pieces 111, and the pair of gripping shafts 122 that connect the pair of jig bodies 110 to each other at the second ends 111B on the opposite side of first ends 111A, where the clamping pieces 111 clamp the holder 62, across the intersection P. Therefore, even when a hand does not fit in the spacing between the cleaning member 60 and the rotation device 70, the pair of the gripping shafts 122 can be operated from outside the spacing to open and close the clamping pieces 111 respectively.

Further, in the present embodiment, the fixing member 130 is included for fixing the pair of gripping shafts 122 to each other and maintaining the clamped state. According to this configuration, since the clamped state of the pair of jig bodies 110 can be maintained, for example, the work of adjusting the angle of the attaching and detaching jig 100 (cleaning member 60) when attaching the cleaning member 60 to the rotation device 70 described above is facilitated.

In addition, in the present embodiment, as shown in FIG. 6, the annular groove 122c is formed on the peripheral surface of at least one of the pair of gripping shafts 122, and the fixing member 130 is engaged with the annular groove 122c. According to this configuration, since axial movement of the fixing member 130 along the gripping shafts 122 is regulated, the fixing member 130 does not move when the attaching and detaching jig 100 is tilted or the like, thus improving the workability of attaching and detaching the cleaning member 60.

Also, in the present embodiment, the connecting shaft 121 is connected rotatably relative to the clamping pieces 111, and each of the pair of gripping shafts 122 is connected non-rotatably relative to the clamping pieces 111. According to this configuration, while the clamping pieces 111 are connected to be openable and closable by the connecting shaft 121, since the pair of gripping shafts 122 are not rotated relative to the clamping pieces 111, the handling performance of the attaching and detaching jig 100 is improved.

Having described exemplary embodiments of the disclosure, it should be understood that the exemplary embodiments are illustrative of the disclosure and are not to be considered as limiting. Additions, omissions, substitutions, and other modifications may be made without departing from the scope of the disclosure. Accordingly, the disclosure should not be regarded as limited by the foregoing description, but is defined by the claims.

For example, a configuration as shown in FIG. 8 below may be adopted.

FIG. 8 is a front view of a jig 100 for attaching and detaching the cleaning member 60 according to a modified example of one embodiment. The attaching and detaching jig 100 shown in FIG. 8 is provided with an interval adjustment mechanism 150 for adjusting an interval between the pair of jig bodies 110. The interval adjustment mechanism 150 employs a telescopic structure in which both the connecting shaft 121 and the pair of gripping shafts 122 of the connecting mechanism 120 are axially expanded and contracted.

Each of the connecting shaft 121 and the pair of gripping shafts 122 is divided axially into two shafts, and a hole 151 is formed on one shaft and a rod 152 is formed on the other shaft, and the hole 151 and the rod 152 are slidably engaged with each other axially. A set screw 153 is inserted into the hole 151 from the outside in the radial direction, and by tightening the rod 152 through the set screw 153, the length of the shaft, that is, the interval between the pair of jig bodies 110, can be adjusted. According to this configuration, the attaching and detaching jig 100 can be used to attach and detach cleaning members 60 of different lengths without replacing the connecting shaft 121 and the pair of gripping shafts 122 with longer ones.

What is claimed is:

1. A jig adapted for attaching and detaching a cleaning member, the cleaning member comprising: a body scrubbing and cleaning an object; and a holder holding the body, wherein two ends of the holder are attachable to and detachable from a rotation device, the jig comprising:
    a pair of jig bodies for clamping the two ends of the holder exposed from a spacing between the body and the rotation device; and
    a connecting mechanism connecting the pair of jig bodies and interlocking movements of the pair of jig bodies between a clamped state in which the two ends of the holder are clamped and a non-clamped state in which the clamped state is released, the connecting mechanism including:
    a connecting shaft connecting the pair of jig bodies to each other at an intersection of clamping pieces; and
    a pair of gripping shafts connecting the pair of jig bodies to each other at a second end on an opposite side of a first end, where the clamping pieces are configured to clamp the holder, across the intersection,
    a fixing member fixing the pair of gripping shafts and maintaining the clamped state, the fixing member including:
    a first through hole; and
    a hook with a second through hole;
    wherein one of the pair of gripping shafts is inserted into the first through hole, and the hook is engaged with another of the pair of gripping shafts,
    wherein the first through hole and the second through hole extend in the same direction and entirely through a width of the fixing member.

2. The jig adapted for attaching and detaching the cleaning member according to claim 1, wherein each of the pair of jig bodies comprises the clamping pieces that intersect at one intersection and are openable and closable around the intersection.

3. The jig adapted for attaching and detaching the cleaning member according to claim 2, wherein an annular groove is formed on a peripheral surface of at least one of the pair of gripping shafts, and
    the fixing member is engaged with the annular groove.

4. The jig adapted for attaching and detaching the cleaning member according to claim 2, wherein the connecting shaft is connected rotatably relative to the clamping pieces, and each of the pair of gripping shafts is connected non-rotatably relative to the clamping pieces.

5. The jig adapted for attaching and detaching the cleaning member according to claim 3, wherein the connecting shaft is connected rotatably relative to the clamping pieces, and each of the pair of gripping shafts is connected non-rotatably relative to the clamping pieces.

6. The jig adapted for attaching and detaching the cleaning member according to claim 1, comprising an interval adjustment mechanism for adjusting a distance between the pair of jig bodies.

7. The jig adapted for attaching and detaching the cleaning member according to claim 2, comprising an interval adjustment mechanism for adjusting a distance between the pair of jig bodies.

8. The jig adapted for attaching and detaching the cleaning member according to claim 3, comprising an interval adjustment mechanism for adjusting a distance between the pair of jig bodies.

9. The jig adapted for attaching and detaching the cleaning member according to claim 4, comprising an interval adjustment mechanism for adjusting a distance between the pair of jig bodies.

\* \* \* \* \*